(12) United States Patent
Murakami et al.

(10) Patent No.: US 6,794,031 B2
(45) Date of Patent: Sep. 21, 2004

(54) COVER-LAY FILM AND PRINTED CIRCUIT BOARD HAVING THE SAME

(75) Inventors: Tooru Murakami, Yamaguchi (JP); Toyofumi Asano, Saitama (JP); Masahiro Imaizumi, Tokyo (JP)

(73) Assignees: Ube Industries, Ltd., Yamaguchi (JP); Nippon Kayaku Co., Ltd., Tokyo (JP)

( * ) Notice: Subject to any disclaimer, the term of this patent is extended or adjusted under 35 U.S.C. 154(b) by 0 days.

(21) Appl. No.: 10/252,697

(22) Filed: Sep. 24, 2002

(65) Prior Publication Data

US 2003/0091842 A1 May 15, 2003

(30) Foreign Application Priority Data

Sep. 28, 2001 (JP) .......................................... 2001-303037

(51) Int. Cl.$^7$ .......................... B32B 7/02; B32B 27/18; B32B 27/34; B32B 27/38; C08K 3/22
(52) U.S. Cl. .............................. 428/355 EP; 428/42.3; 428/413; 428/414; 428/416; 523/527; 525/119; 525/183
(58) Field of Search .......................... 428/42.3, 355 EP, 428/413, 414, 416; 525/119, 183; 523/457

(56) References Cited

U.S. PATENT DOCUMENTS

| | | | |
|---|---|---|---|
| 5,342,895 A | * | 8/1994 | Tagami et al. .............. 525/183 |
| 6,217,996 B1 | * | 4/2001 | Yamamoto et al. ......... 428/220 |
| 6,287,532 B1 | * | 9/2001 | Okada et al. ............ 423/420.2 |

FOREIGN PATENT DOCUMENTS

| | | | |
|---|---|---|---|
| JP | 61-276851 A | * | 12/1986 |
| JP | 4-202321 A | * | 7/1992 |
| JP | B2 3088435 | | 7/2000 |
| JP | A 2000-219854 | | 8/2000 |
| JP | A 2000-290611 | | 10/2000 |
| JP | A 2001-81282 | | 3/2001 |
| JP | 2001-81287 A | * | 3/2001 |
| JP | 2001-123132 A | * | 5/2001 |
| JP | 2001-139775 A | * | 5/2001 |
| JP | 2001-220557 A | * | 8/2001 |

OTHER PUBLICATIONS

Chemical abstracts accesion No. 2000:484175 for Japanese Patent No. 2000–198969 A2, Ube Industries, Limited, Jul. 18, 2000.*

* cited by examiner

*Primary Examiner*—Robert Sellers
(74) *Attorney, Agent, or Firm*—Young & Thompson

(57) ABSTRACT

A cover-lay film comprising a heat-resistant film and an adhesive layer, wherein the adhesive layer is formed of an epoxy resin composition containing (a) an epoxy resin, (b) a curing agent, (c) a phenolic hydroxyl-containing polyamide-poly(butadiene-acrylonitrile) copolymer, and (d) an ion capturing agent and having a glass transition temperature of 80° C. or higher after cure, and the heat-resistant film mainly comprises a polyimide containing a 3,3',4,4'-biphenyltetracarboxylic acid component and a p-phenylenediamine component and has a specific coefficient of linear thermal expansion and a specific tensile modulus in both machine and transverse directions.

10 Claims, No Drawings

COVER-LAY FILM AND PRINTED CIRCUIT BOARD HAVING THE SAME

BACKGROUND OF THE INVENTION

1. Field of the Invention:

The present invention relates to a cover-lay film for high-density mounting which exhibits satisfactory performance in adhesion at relatively low temperatures, peel strength, solder heat resistance, moisture resistance, circuit space filling capabilities, and electrical reliability and to a printed circuit board obtained by using the cover-lay film.

2. Description of the Related Art:

With the recent drastic development in the field of electronics, size and weight reduction and density increase of electronic equipment especially for communications systems and consumer products have been observed, and the performance requirements have become more exacting. In this connection, flexible printed circuit boards (hereinafter "PCBs"), featuring flexibility and repeated bending endurance, enable three-dimensional and high-density mounting in a limited space and have been broadening their applications to wiring of electronic equipment, cables and composite components having a connector function. Flexible PCBs are fabricated of a flexible base material on which a circuit pattern is formed in a usual manner. The circuit is protected with a cover-lay film for some applications.

A base material for flexible PCBs is an integral laminate composed of an insulating base film having high heat resistance and excellent electrical and mechanical characteristics and a metal foil bonded with an adhesive. Characteristics required of the base material for flexible PCBs include adhesion, intimate contact capabilities, heat resistance, electrical properties, and processability.

The latest tendencies, such that chips-on-flex (COFs, IC chips directly attached onto a flexible printed wiring board) have been put to practical use and that base materials for flexible PCBs have come to be adopted as an interposer of chip-scale-packages (CSPs) and multichip modules (MCMs), have demanded further improvements on heat resistance and moisture resistance of base materials for flexible PCBs as a semiconductor package constituent.

A cover-lay film is provided for circuit protection, improved flexibility of flexible PCBs, and the like. Cover-lay films include film base types composed of an insulating base film having an adhesive applied to one side thereof, dry film types of which the adhesive layer also serves as an insulation layer, and liquid types. These cover-lay films are required to have storage stability, intimate contact capabilities, heat resistance, electrical properties, and processability.

Available cover-lay films having an epoxy resin composition as an adhesive have low electrical reliability while satisfactory in adhesion, moisture resistance, circuit space filling capabilities, and solder heat resistance. This drawback is, as is pointed out, attributed to inorganic ions used in the synthesis of a butadiene-acrylonitrile copolymer which is usually compounded into an epoxy resin.

A cover-lay film having a pyromellitic acid-based polyimide film (e.g., Kapton H from E. I. du Pont) as a base film coated on one side with an epoxy resin adhesive is known. However, such a base film has low dimensional stability, and the mechanical properties of the cover-lay film greatly reduce on moisture absorption, which make the cover-lay film unfit for high-density mounting.

SUMMARY OF THE INVENTION

An object of the present invention is to provide a cover-lay film for high-density mounting which is capable of sticking at relatively low temperature to exhibit satisfactory adhesion, satisfactory in solder heat resistance, moisture resistance, and circuit space filling capabilities, and excellent in electrical characteristics, dimensional stability, and mechanical properties. Another object is to provide a circuit board having the cover-lay film.

The present invention provides a cover-lay film comprising a heat-resistant film and an adhesive layer, wherein the adhesive layer comprises an epoxy resin composition containing (a) an epoxy resin, (b) a curing agent, (c) a phenolic hydroxyl-containing polyamide-poly(butadiene-acrylonitrile) copolymer, and (d) an ion capturing agent and having a glass transition temperature of 80° C. or higher after cure, the heat-resistant film is a polyimide film mainly comprising a polyimide containing a 3,3',4,4'-biphenyltetracarboxylic acid component and a p-phenylenediamine component and having a coefficient of linear thermal expansion of 10 to 25 ppm/° C. in a temperature range of 50 to 200° C. in both machine and transverse directions and a tensile modulus of 450 to 1100 kgf/mm² in both machine and transverse directions, and the cover-lay film has such electrical reliability that the surface insulation resistance measured at 121° C. and 85% RH with an applied voltage of 50 V using a comb pattern of IPC-B-25 from level B up, preferebly from level A up, shows no reduction for more than 200 hours.

The present invention also provides a circuit board produced by using the cover-lay film.

DETAILED DESCRIPTION OF THE INVENTION

It is essential that the adhesive of the adhesive layer and the substrate film (heat-resistant film) should satisfy all their respective requirements described above to provide a highly reliable cover-lay film for high-density mounting. Should any one of the requirements be unfulfilled, the objects of the present invention are not accomplished.

The adhesive used in the present invention is an epoxy resin composition comprising (a) an epoxy resin, (b) a curing agent, (c) a phenolic hydroxyl-containing polyamide-poly(butadiene-acrylonitrile) copolymer, and (d) an ion capturing agent and having a glass transition temperature of 80° C. or higher after cure.

The epoxy resin as component (a) includes, but is not limited to, polyfunctional epoxy resins which are glycidyl ethers of polyphenol compounds, polyfunctional epoxy resins which are glycidyl ethers of various novolak resins, alicyclic epoxy resins, aliphatic epoxy resins, heterocyclic epoxy resins, glycidyl ester type epoxy resins, glycidylamine type epoxy resins, and glycidylated halogenated phenol epoxy resins. The term "polyfunctional epoxy resins" denotes epoxy resins having two or more glycidyl groups per molecule.

The polyphenol compounds providing the polyfunctional epoxy resins (glycidyl ethers) include bisphenol A, bisphenol F, bisphenol S, 4,4'-biphenylphenol, tetramethylbisphenol A, dimethylbisphenol A, tetramethylbisphenol F, diemthylbisphenol F, tetramethylbisphenol S, diemthylbisphenol S, tetramethyl-4,4'-biphenol, dimethyl-4,4'-biphenolphenol, 1-(4-hydroxyphenyl)-2-[4-(1,1-bis(4-hydroxyphenyl)ethyl)phenyl]propane, 2,2'-methylenebis(4-methyl-6-t-butylphenol), 4,4'-butylidenebis(3-methyl-6-t- butylphenol), trishydroxyphenyl-methane, resorcinol, hydroquinone, pyrogallol, phenols having a diisopropylidene skeleton, phenols having a fluorene skeleton, e.g., 1,1-di-4-hydroxyphenylfluorene, and phenolated polybutadiene.

The novolak resins providing the polyfunctional epoxy resins (glycidyl ethers) include those prepared from phenol compounds, such as phenol, cresols, ethylphenols, butylphenols, octylphenols, bisphenol A, bisphenol F, bisphenol S, and naphthols; xylylene skeleton-containing phenol novolak resins, dicyclopentadiene skeleton-containing phenol novolak resins, biphenyl skeleton-containing phenol novolak resins, fluorene skeleton-containing phenol novolak resins, furan skeleton-containing phenol novolak resins, and triphenylmethane skeleton-containing novolak resins.

The alicyclic epoxy resins include those having an aliphatic skeleton such as cyclohexane. The aliphatic epoxy resins include glycidyl ethers of polyhydric alcohols, such as 1,4-butanediol, 1,6-hexanediol, polyethylene glycol, and pentaerythritol.

The heterocyclic epoxy resins include those having an isocyanuric ring, a hydantoin ring, etc. as a heterocyclic ring. The glycidyl ester type epoxy resins include those derived from carboxylic acids, such as hexahydrophthalic acid diglycidyl ester. The glycidylamine type epoxy resins include those derived from amines, such as aniline and toluidine, by glycidylation.

The glycidylated halogenated phenol epoxy resins include those derived from halogenated phenols, such as brominated bisphenol A, brominated bisphenol F, brominated bisphenol S, brominated phenol novolak, brominated cresol novolak, chlorinated bisphenol S, and chlorinated bisphenol A, by glycidylation.

While selection of an epoxy resin from among those recited depends on the required characteristics, it is preferred to use glycidyl ether type epoxy resins, particularly bisphenol A epoxy resins, bisphenol F epoxy resins, phenol novolak epoxy resins, cresol novolak epoxy resins, novolak epoxy resins having a phenol skeleton and a naphthol skeleton, novolak epoxy resins having a phenol skeleton and a biphenyl skeleton, novolak epoxy resins having a triphenylmethane skeleton, and novolak epoxy resins having a dicyclopentadiene skeleton. Of the novolak epoxy resins having a phenol skeleton and a naphthol skeleton those having a methyl group in the phenol skeleton are preferred. Such novolak epoxy resins are available, for example, under trade names NC-7000 and NC-7300 both from Nippon Kayaku Co., Ltd. The novolak epoxy resins having a phenol skeleton and a biphenyl skeleton are available, for example, under a trade name NC-3000P from Nippon Kayaku Co., Ltd. The novolak epoxy resins having a triphenylmethane skeleton are available from, e.g., Nippon Kayaku Co., Ltd. under trade names of EPPN-501H and EPPN-502H. The novolak epoxy resins having a dicyclopentadiene skeleton are available, for example, from Nippon Kayaku Co., Ltd. under a trade name XD-1000. These epoxy resins can be used either individually or as a combination of two or more thereof for imparting heat resistance, flame retardance or like functions.

The curing agent as component (b) includes acid anhydrides, amines, phenols, imidazoles, dihydrazines, Lewis acids, Brönsted acid salts, polymercaptans, isocyanates, and blocked isocyanates.

The acid anhydrides include aromatic carboxylic acid anhydrides, such as phthalic anhydride, trimellitic anhydride, pyromellitic anhydride, benzophenonetetracarboxylic acid anhydride, ethylene glycol anhydrotrimellitate, and biphenyltetracarboxylic acid anhydride; aliphatic carboxylic acid anhydrides, such as azelaic anhydride, sebacic anhydride, and dodecanedicarboxylic acid anhydride; and alicyclic carboxylic acid anhydrides, such as tetrahydrophthalic anhydride, hexahydrophthalic anhydride, nudic anhydride, chlorendic anhydride, and hymic anhydride.

The amines include aromatic amines, such as diaminodiphenylmethane, diaminodiphenyl sulfone, diaminodiphenyl ether, p-phenylenediamine, m-phenylenediamine, o-phenylenediamine, 1,5-diaminonaphthalene, and m-xylylenediamine; aliphatic amines, such as ethylenediamine, diethylenediamine, isophoronediamine, bis(4-amino-3-methyldicyclohexyl)methane, and polyether diamine; and guanidines, such as dicyandiamide and 1-(o-tolyl)biguanide.

The phenols include bisphenol A, bisphenol F, bisphenol S, 4,4'-biphenylphenol, tetramethylbisphenol A, dimethyl bisphenol A, tetramethyl bisphenol F, dimethyl bisphenol F, tetramethyl bisphenol S, dimethyl bisphenol S, tetramethyl-4,4'-biphenol, dimethyl-4,4'-biphenylphenol, 1-(4-hydroxyphenyl)-2-[4-(1,1-bis(4-hydroxyphenyl)-ethyl)phenyl]propane, 2,2'-methylenebis(4-methyl-6-t-butylphenol), 4,4'-butylidenebis-(3-methyl-6-t-butylphenol), trishydroxyphenylmethane, resorcinol, hydroquinone, pyrogallol, phenols having a diisopropylidene skeleton, phenols having a fluorene skeleton, e.g., 1,1-di-4-hydroxyphenylfluorene, phenolated polybutadiene; novolak resins prepared from various phenol compounds, such as phenol, cresols, ethylphenols, butylphenols, octylphenols, bisphenol A, bisphenol F, bisphenol S, and naphthols; xylylene skeleton-containing phenol novolak resins; dicyclopentadiene skeleton-containing phenol novolak resins; biphenyl skeleton-containing phenol novolak resins; fluorene skeleton-containing phenol novolak resins; furan skeleton-containing phenol novolak resins; and halogenated phenols, such as brominated bisphenol A, brominated bisphenol F, brominated bisphenol S, brominated phenol novolak, brominated cresol novolak, chlorinated bisphenol S, and chlorinated bisphenol A.

The imidazoles include 2-methylimidazole, 2-phenylimidazole, 2-undecylimidazole, 2-heptadecylimidazole, 2-phenyl-4-methylimidazole, 1-benzyl-2-phenylimidazole, 1-benzyl-2-methylimidazole, 1-cyanoethyl-2-methylimidazole, 1-cyanoethyl-2-phenylimidazole, 1-cyanoethyl-2-undecylimidazole, 2,4-diamino-6(2'-methylimidazole(1'))ethyl-s-triazine, 2,4-diamino-6(2'-undecylimidazole(1'))ethyl-s-triazine, 2,4-diamino-6-(2'-ethyl,4-methylimidazole(1'))-ethyl-s-triazine, 2,4-diamino-6-(2'-methylimidazole(1'))ethyl-s-triazine isocyanuric acid adduct, 2-methylimidazole isocyanuric acid 2:3 adduct, 2-phenylimidazole isocyanuric acid adduct, 2-phenyl-3,5-dihydroxymethylimidazole, 2-phenyl-4-hydroxymethyl-5-methylimidazole, and 1-cyanoethyl-2-phenyl-3,5-dicyanoethoxymethylimidazole; and salts between these imidazoles and polycarboxylic acids, such as phthalic acid, isophthalic acid, terephthalic acid, trimellitic acid, pyromellitic acid, naphthalenedicarboxylic acid, maleic acid, and oxalic acid.

While selection of a curing agent as component (b) from among those recited depends on the characteristics required of the adhesive, it is preferred to use the phenol curing agents.

The curing agent is used in an equivalent ratio usually of from 0.3 to 2.0, preferably 0.4 to 1.6, still preferably 0.5 to 1.3, to epoxy equivalent of the epoxy resin (a). The curing agents recited above can be used either solely or as a combination thereof.

The phenolic hydroxyl-containing polyamide-poly (butadiene-acrylonitrile) copolymer as component (c) is necessary to secure flexural and bending endurance and adhesion. That is, component (c) imparts flexibility to a cured product and increased adhesive strength to the other constituent components of the flexible base material.

Component (c) is preferably used in an amount of 5 to 90% by weight, particularly 30 to 70% by weight, based on the total organic components of the epoxy resin composition.

The phenolic hydroxyl-containing polyamide-poly (butadiene-acrylonitrile) copolymer can be synthesized by starting with condensation between a dicarboxylic acid component containing a phenolic hydroxyl-containing dicarboxylic acid (the phenolic hydroxyl-containing dicarboxylic acid can be used alone in some cases) and a diamine component.

For example, a dicarboxylic acid component comprising a phenolic hydroxyl-containing dicarboxylic acid (e.g., 5-hydroxyisophthalic acid) and a dicarboxylic acid having no phenolic hydroxyl group (e.g., isophthalic acid) and an excess of a diamine component are condensed by heating with stirring in an organic solvent (e.g., N-methyl-2-pyrrolidone) in the presence of a condensing agent (e.g., a phosphorous ester) and a pyridine derivative in an inert gas atmosphere (e.g., nitrogen) to produce a solution of a phenolic hydroxyl-containing polyamide oligomer having an amino group at both ends. To the resulting polyamide oligomer solution is added a butadiene-acrylonitrile copolymer having a carboxyl group at both ends to carry out polycondensation to obtain a phenolic hydroxyl-containing polyamide-poly(butadiene-acrylonitrile) copolymer.

While not limiting, the butadiene-acrylonitrile copolymer is usually used in an amount of about 0.1 to 10 parts by weight per part by weight of the polyamide oligomer.

It is possible that the dicarboxylic acid component is used in excess over the diamine component to synthesize a phenolic hydroxyl-containing polyamide oligomer having a carboxyl group at both ends, which is then block copolymerized with a butadiene-acrylonitrile copolymer having an amino group at both ends. It is also possible that the terminals of the polyamide or the butadiene-acrylonitrile copolymer are modified and then allowed to react. In this case, one of them is modified with a vinyl group, and the other with an —NH group or an —SH group. In the synthesis of component (c), part or the whole of the diamine component may be replaced with a diamine compound having a phenolic hydroxyl group.

The phenolic hydroxyl-containing dicarboxylic acids which can be used to synthesize the phenolic hydroxyl-containing polyamide-poly(butadiene-acrylonitrile) copolymer include 5-hydroxyisophthalic acid, 4-hydroxyisophthalic acid, 2-hydroxyphthalic acid, 3-hydroxyphthalic acid, and 2-hydroxyterephthalic acid. The dicarboxylic acids having no phenolic hydroxyl group include phthalic acid, isophthalic acid, terephthalic acid, naphthalenedicarboxylic acid, succinic acid, fumaric acid, glutaric acid, adipic acid, 1,3-cyclohexanedicarboxylic acid, 4,4'-diphenyldicarboxylic acid, and 3,3'-methylenedibenzoic acid.

The diamine components include, but are not limited to, those having a phenolic hydroxyl group, such as 3,3'-diamine-4,4'-dihydroxyphenylmethane, 2,2-bis(3-amino-4-hydroxyphenyl)hexafluoropropane, 2,2-bis(3-amino-4-hydroxyphenyl)-difluoromethane, 3,4-diamino-1,5-benzenediol, 3,3'-dihydroxy-4,4'-diaminobisphenyl, 3,3'-diamino-4,4'-dihydroxybiphenyl, 2,2-bis(3-amino-4-hydroxyphenyl)ketone, 2,2-bis(3-amino-4-hydroxyphenyl) sulfide, 2,2-bis(3-amino-4-hydroxyphenyl) ether, 2,2-bis(3-amino-4-hydroxyphenyl)sulfone, 2,2-bis(3-amino-4-hydroxyphenyl)propane, 2,2-bis(3-hydroxy-4-aminophenyl)propane, and 2,2-bis(3-hydroxy-4-aminophenyl)-methane; and those having no phenolic hydroxyl group, such as 3,3'-diaminodiphenyl ether, 3,4'-diaminodiphenyl ether, 4,4'-diaminodiphenyl ether, diaminonaphthalene, piperazine, hexamethylenediamine, tetramethylenediamine, m-xylenediamine, 4,4'-diaminodiphenylmethane, 4,4'-diaminobenzophenone, 2,2'-bis(4-aminophenyl)-propane, 3,3'-diaminodiphenylsulfone, and 3,3'-diaminodiphenyl. Preferred of them is 3,4'-diaminodiphenyl ether.

The phenolic hydroxyl-containing polyamide-poly (butadiene-acrylonitrile) copolymer which is particularly preferred in the present invention is represented by formula:

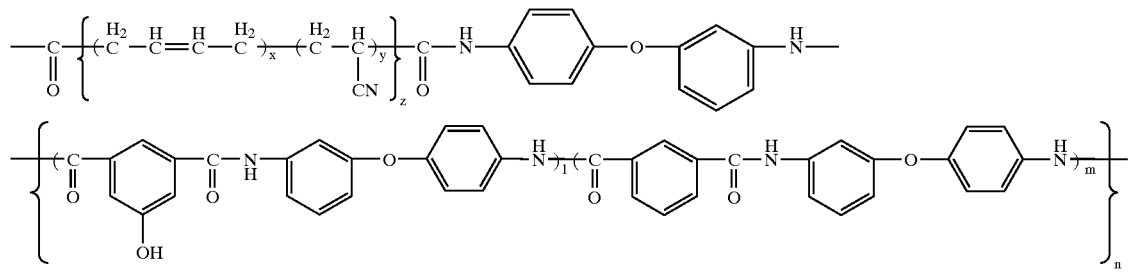

wherein x, y, z, l, m, and n are each an integer representing an average degree of polymerization, in which x is 3 to 10; y is 1 to 4; z is 5 to 15; (l+m) is 2 to 200; l/(l+m) is equal to or greater than 0.04; and n is 2 to 100.

Butadiene-acrylonitrile copolymers with various functional groups at both ends thereof are commercially available from B. F. Goodrich under a series of trade names Hycar CTBN, which can be made use of in block copolymerization with the phenolic hydroxyl-containing polyamide oligomer.

The ion capturing agent as component (d) includes hydrotalcite compounds represented by formula:

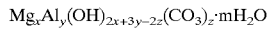

wherein x, y, and z each represent a number satisfying the relationships:

0<y/x≦1 and 0≦z/y<1.5; and m represents a positive number.

It is considered that the hydrotalcite compounds are capable of capturing halide ions present in the epoxy resin composition through substitution for their own $CO_3^{2-}$ or coordinate bonding. The hydrotalcite compounds are classified into many types according to the ratio of the numbers x, y and z, etc. Such hydrotalcite compounds can be used either individually or as a mixture of two or more thereof. It is preferred for the hydrotalcite compounds to have an average particle size of 5 μm or smaller and a maximum particle size of 10 μm or smaller from the standpoint of dispersibility in the epoxy resin composition. The hydrotalcite compounds are preferably used in a total amount of 0.1 to 30% by weight based on the resinous component of the epoxy resin composition. In amounts smaller than 0.1% by weight, the effects in improving the high-temperature exposure properties are not sufficiently manifested. In amounts exceeding 30% by weight, reduction in moisture resistance can result.

The ion capturing agent which can be used as component (d) also includes a hydroxide of bismuth, a hydroxide of aluminum, an oxide of bismuth, and an oxide of aluminum which each have not more than 5 ppm of each of a chloride ion content, a bromide ion content, and a nitrate ion content. Presence of more than 5 ppm of any one of these ions can result in reduction of moisture resistance of a semiconductor device. Typical examples of this type of ion capturing agents are bismuth hydroxide, aluminum hydroxide, dibismuth trioxide, and dialuminum trioxide. They can be used either alone or in combination. They are preferably added in a total amount of 0.1 to 10% by weight based on the resinous component of the epoxy resin composition. In amounts smaller than 0.1% by weight, sufficient effects in improving the high-temperature exposure properties are not exhibited. In amounts exceeding 10% by weight, reduction in moisture resistance can result. It is preferred for these bismuth or aluminum compounds to have an average particle size of 0.05 to 5 μm and a maximum particle size of 10 μm or smaller. Greater particles tend to have poor dispersibility for producing sufficient effects in improving high-temperature exposure properties. When both of the hydrotalcite compound and the bismuth or aluminum compound are used in combination, they are preferably used in a total amount of 0.1 to 20% by weight based on the resinous component of the epoxy resin composition.

The epoxy resin composition of the present invention preferably has a glass transition point (Tg) of 80° C. or higher, particularly 120° C. or higher, after cure from the viewpoint of heat resistance, moisture resistance, and pressure cooker resistance. The Tg referred to herein is the maximum temperature of tanδ measured on a cured film sample of the epoxy resin composition by dynamic mechanical analysis (DMA).

If desired, the epoxy resin composition can contain a cure accelerator. Examples of suitable cure accelerators include phosphorus compounds, such as triphenylphosphine; tertiary amine compounds, such as triethylamine, tetraethanolamine, 1,8-diazabicyclo[5.4.0]-7-undecene (DBU), N,N-dimethylbenzylamine, 1,1,3,3-tetramethylguanidine, 2-ethyl-4-methylimidazole, and N-methylpiperazine, and boron compounds, such as 1,8-diazabicyclo[5.4.0]-7-undecenium tetraphenylborate.

If desired, the epoxy resin composition can contain other additives, such as plasticizers, e.g., natural waxes, synthetic waxes, and long-chain aliphatic acid metal salts; parting agents, e.g., acid amides, esters, and paraffins; stress relaxants, e.g., nitrile rubber and butadiene rubber; inorganic flame retardants, e.g., antimony trioxide, antimony pentoxide, tin oxide, tin hydroxide, molybdenum oxide, zinc borate, barium metaborate, red phosphorus, aluminum hydroxide, magnesium hydroxide, and calcium aluminate; bromine flame retardants, e.g., tetrabromobisphenol A, tetrabromophthalic anhydride, hexabromobenzene, and brominated phenol novolak; coupling agents, e.g., silane coupling agents, titanate coupling agents, and aluminum coupling agents; inorganic fillers or conductive particles, e.g., fused silica, crystalline silica, low α-radiation silica, glass flakes, glass beads, glass balloons, talc, alumina, calcium silicate, aluminum hydroxide, calcium carbonate, barium sulfate, magnesia, silicon nitride, boron nitride, ferrite, rare earth cobalt, gold, silver, nickel, copper, lead, iron powder, iron oxide, iron sand, graphite, carbon, red oxide, and chromium yellow; colorants (dyes and pigments); inorganic fibers, e.g., carbon fiber, glass fiber, boron fiber, silicon carbide fiber, alumina fiber, and silica alumina fiber; organic fibers, e.g., aramid fiber, polyester fiber, cellulose fiber, and carbon fiber; oxidation stabilizers, light stabilizers, moisture resistance improving agents, thixotropic agents, diluents, defoaming agents, other resins, tackifiers, antistatics, lubricants, and ultraviolet absorbers.

The epoxy resin composition is obtained by mixing the above-described components (a) to (d), and if desired, the cure accelerator and other additives. For example, the components are uniformly mixed in a solvent at a predetermined ratio to prepare a varnish. The solvent includes, but are not limited to, toluene, ethanol, cellosolves, tetrahydrofuran, N-methyl-2-pyrrolidone, dimethylformamide, and methyl ethyl ketone. The solvent is used in such an amount that the resulting varnish may usually have a solids content of about 20 to 60% by weight.

The epoxy resin composition cures chiefly through heat cure. Heat cure may be combined with cold-setting which takes place at room temperature in the presence of a catalyst, oxygen or moisture or photo-setting which is catalyzed by an acid generated on ultraviolet irradiation.

The epoxy resin composition is applied to one side of a heat-resistant film as a substrate and dried to form a cover-lay film (also called a film base cover-lay). The cover-lay film has a three-layer structure of heat-resistant film (polyimide film)/adhesive layer (the dry film of the epoxy resin composition)/release film. The adhesive layer usually has a thickness of 4 to 50 μm, suitably 10 to 50 μm, while varying according to the condition of use.

The polyimide film which is used as a heat-resistant substrate of the cover-lay film is made mainly of a polyimide comprising an aromatic tetracarboxylic acid component containing 3,3',4,4'-biphenyltetracarboxylic acid component and an aromatic diamine component containing p-phenylenediamine and has a coefficient of linear thermal expansion of 10 to 25 ppm/° C. in a temperature range of 50 to 200° C. in both the machine direction (MD) and the transverse direction (TD) and a tensile modulus of 450 to 1100 kgf/mm$^2$ in both MD and TD. The 3,3',4,4'-biphenyltetracarboxylic acid component may be used in combination with other aromatic tetracarboxylic acid components, such as pyromellitic dianhydride and 3,3',4,4'-benzophenonetetracarboxylic acid dianhydride. The other tetracarboxylic acid components can be used in a proportion up to 90 mol %, preferably up to 60 mol %, based on the total aromatic tetracarboxylic acid component. The p-phenylenediamine component may be used in combination with 4,4'-diaminodiphenyl ether. 4,4'-Diaminodiphenyl ether can be used in a proportion up to 90 mol %, preferably up to 70 mol %, based on the total aromatic diamine component.

If the linear thermal expansion coefficients and the tensile moduluses of the polyimide film are out of the above-recited ranges, the substrate film tends to cause warpage of a high-density flexible PCB to which it is applied or have reduced self-supporting properties.

The polyimide film preferably has a thickness of 10 to 55 $\mu$m.

A preferred process for preparing the polyimide film having the controlled linear thermal expansion coefficients and tensile moduluses is described below for illustrative purpose only.

The aromatic tetracarboxylic acid component and p-phenylenediamine are polymerized in an organic polar solvent commonly employed in the production of polyimides, such as N,N-dimethylacetamide or N-methyl-2-pyrrolidone, preferably at 10 to 80° C. for 1 to 30 hours to prepare a polyamic acid (degree of imidation: 5% or less) solution having a polymer concentration of 15 to 25% by weight and a rotational viscosity of 500 to 4500 P (at 30° C.), in which the polymer has a logarithmic viscosity of 1.5 to 5 as measured at 30° C. as a 0.5 g/100 ml solution in N-methyl-2-pyrrolidone.

To the resulting polyamic acid solution is added a phosphorus compound, and preferably an inorganic filler is further added, to prepare a polyimide precursor solution composition. The phosphorus compound preferably includes an organic phosphorus compound, particularly a (poly) phosphoric ester or an amine salt of a phosphoric ester, and an inorganic phosphorus compound. The phosphorus compound is preferably added in an amount of 0.01 to 5 parts by weight, particularly 0.01 to 3 parts by weight, especially 0.01 to 1 part by weight, per 100 parts by weight of the polyamic acid. The inorganic filler preferably includes colloidal silica, silicon nitride, talc, titanium oxide, and calcium phosphate and desirably has an average particle size of 0.001 to 5 $\mu$m, especially 0.005 to 2 $\mu$m. The inorganic filler is preferably added in an amount of 0.01 to 10 parts by weight per 100 parts by weight of the polyamic acid.

The resulting polyimide precursor solution composition is continuously cast on a metallic carrier having a smooth surface, and the cast film is dried by heating at 120 to 170° C. for about 2 to 20 minutes to form a self-supporting film having a volatile content (the solvent and produced water) of about 25 to 40% by weight. The self-supporting film may be treated with a surface treating agent, such as an aminosilane coupling agent, or may be dried further as such.

The self-supporting film is clamped at both edges by a film clamp and inserted into a continuous heating oven. While running in the oven, the film is allowed to shrink in the transverse direction without sagging until it is heated to 300° C. at which shrinkage on drying completes substantially. The film is heated to dry and imidate in the oven under such conditions that the highest heating temperature ranges from about 400 to 525° C., particularly the film is exposed to a temperature of about 475 to 500° C. for 0.5 to 30 minutes. The imidation is completed with a residual volatile content of about 0.4% by weight or less to provide an aromatic polyimide film of continuous form.

The resulting aromatic polyimide film is preferably subjected to stress relaxation by heating at about 200 to 400° C. under low or no tension and taken up in roll. There is thus obtained a polyimide film having a thickness of 10 to 55 $\mu$m, preferably about 10 to 50 $\mu$m, a linear thermal expansion coefficient of 10 to 25×10$^{-6}$ cm/cm/° C. at 50 to 200° C. in both MD and TD, and a tensile modulus of 450 to 1100 kgf/mm$^2$ in both MD and TD.

The polyimide film with the controlled linear thermal expansion coefficients and tensile moduluses may be subjected to one or more discharge treatments, such as a plasma discharge treatment (vacuum or atmospheric plasma discharge treatment) or a corona discharge treatment, preferably a vacuum plasma discharge treatment, to improve adhesion. Prior to the discharge treatment, the film surface may be treated with an organic solvent, such as acetone, isopropyl alcohol or ethyl alcohol.

While not limiting, the pressure of the atmosphere for carrying out the vacuum plasma discharge treatment preferably ranges from 0.1 to 1500 Pa. The atmosphere for carrying out the plasma treatment is not particularly limited in gas composition but preferably contains oxygen. The atmosphere may contain 20 mol % or more of a rare gas, such as He, Ne, Ar or Xe. Ar is preferred. A mixture of a rare gas and $CO_2$, $N_2$, $H_2$ or $H_2O$ is useful. The plasma treating time is preferably about 1 second to 10 minutes.

The substrate film and a thin layer of the adhesive are laminated with each other by, for example, applying the above-described varnish on a thermoplastic film to a prescribed thickness, followed by drying to form a thin layer of an uncured adhesive layer and transferring the adhesive layer to the heat-resistant film (substrate) by passing through a pair of heated laminate rolls, or applying the varnish directly to the heat-resistant film to a prescribed thickness followed by drying to form a thin layer of an uncured adhesive layer.

The varnish, in which the above-described components are uniformly dissolved or dispersed in the organic solvent, applied on a film is preferably dried at 80 to 200° C. for about 20 seconds to 100 minutes to substantially remove the solvent.

The release film which can be used in the present invention includes a polyethylene (PE) film, a polypropylene (PP) film, a TPX film, a PE film having a silicone release agent, a PP film having a silicone release agent, PE-coated paper, PP-coated paper, and TPX-coated paper. The thickness of the release film is of appropriate choice according to necessity. A preferred thickness of the plastic release films is 10 to 75 $\mu$m, and that of the paper-based release films is 50 to 200 $\mu$m.

The cover-lay film of the present invention is produced by, for example, applying the prepared varnish (adhesive) to the heat-resistant film by means of a roll coater, a comma coater, etc. and passing the coated film through an in-line drier, where it is heated at 40 to 160° C. for 2 to 20 minutes to remove the solvent from the adhesive thereby to form an adhesive layer. The adhesive layer is preferably laminated with the release film through heat rolls. The dry thickness of the adhesive layer is usually 4 to 50 $\mu$m, particularly 10 to 50 $\mu$m.

The cover-lay film of the present invention is adapted to be applied to a high-density flexible PCB, for example, a circuit-patterned metal-clad laminate composed of a metal (e.g., copper) layer adhered to a polyimide film base either directly or via a heat-resistant adhesive.

The metal-clad laminate composed of a metal (e.g., copper) layer and a polyimide film base bonded together via a heat-resistant adhesive is produced by, for example, forming a polyimide adhesive layer on at least one side of a heat-resistant polyimide film base essentially comprising biphenyltetracarboxylic acid dianhydride or benzophenonetetracarboxylic acid dianhydride and p-phenylenediamine and bonding a metal layer, such as copper foil, onto the polyimide adhesive layer(s) by thermocompression. If desired, the heat-resistant polyimide film base is previously subjected to a discharge treatment, such as a plasma discharge treatment or a corona discharge treatment. The polyimide adhesive layer is formed by, for example, applying a polyimide precursor solution prepared from 1,3-bis(3-aminophenoxybenzene) and 2,3,3',4'-biphenyltetracarboxylic acid dianhydride or a polyimide precursor solution prepared from bis(3,4-dicarboxyphenyl) ether dianhydride and pyromellitic dianhydride and 1,3-bis (3-aminophenoxybenzene) to the polyimide film base, followed by heat drying for imidation.

The metal-clad laminate composed of a metal layer formed directly on a polyimide film base (hereinafter referred to as an adhesiveless metal-clad laminate) is produced by, for example, using a coextruded thermocompression bondable polyimide laminate film as a substrate. The thermocompression bondable polyimide laminate film is prepared by coextruding a thermocompression bondable polyimide layer obtained from, for example, 1,3-bis(4-aminophenoxybenzene) and 2,3,3',4'-biphenyltetracarboxylic acid dianhydride or from bis(3,4-dicarboxyphenyl) ether dianhydride and pyromellitic dianhydride and 1,3-bis(4-aminophenoxybenzene) on at least one side of a highly heat-resistant aromatic polyimide layer. A metal layer, such as copper foil, is thermocompression bonded onto the thermocompression bondable polyimide layer(s) through a continuous hot-press laminator, preferably a double belt press. The temperature of the thermocompression bonding zone is higher than the glass transition temperature of the thermocompression bondable polyimide by 20° C. or more and not higher than 400° C., particularly higher than the glass transition temperature by 30° C. or more and not higher than 400° C. While applying the pressure, the laminate is then cooled in the cooling zone, preferably to a temperature lower than the glass transition temperature of the thermocompression bondable polyimide by 20° C. or more, particularly by 30° C. or more.

The adhesiveless metal-clad laminate is also produced by applying a thermocompression bondable polyimide precursor solution to metal foil, followed by heat drying, and applying a highly heat-resistant aromatic polyimide precursor solution to the thermocompression bondable polyimide layer, followed by heat drying for imidation. The adhesiveless metal-clad laminate is also produced by using a flexible multilayer polyimide film prepared by thinly applying a flexible polyimide precursor solution to a self-supporting film formed of the highly heat-resistant aromatic polyimide precursor solution, followed by heat drying for imidation. After, if necessary, the flexible multilayer polyimide film is subjected to a discharge treatment, such as a plasma discharge treatment, an undercoating metal, e.g., chromium, molybdenum, nickel, bismuth or zinc, and then a metal, e.g., copper, are vacuum deposited on the flexible polyimide film. Finally, the metal-deposited side is plated with copper to form a metal-clad laminate.

The metal layer of the metal-clad laminate is patterned to form a circuit. Patterning is carried out by, for example, printing the metal layer with an etching resist in a circuit pattern, removing the exposed part of the metal layer with an etchant in a usual manner to leave metal traces (wiring), and stripping off the etching resist. The wiring pattern usually has a trace width of about 0.01 to 1.0 mm and a trace pitch of about 0.02 to 2.0 mm.

In applying the cover-lay film to a base material, e.g., a flexible PCB having a circuit pattern of a 1 to 20 μm thick metal foil (preferably copper foil), the uncured adhesive (epoxy resin composition) layer of the cover-lay film is brought into contact with the circuit side of the flexible PCB and press bonded at a temperature lower than about 250° C., preferably about 200° C. or lower, still preferably about 50 to 200° C., particularly preferably about 80 to 200° C., especially preferably about 80 to 180° C., under a pressure of 50 kg/cm² or lower for about 0.5 to 60 minutes to cover the traces and fill the space between the traces. If needed, the laminate is further heated at 100 to 200° C. with no pressure applied for about 10 minutes to 30 hours to cure the adhesive. There is thus obtained a circuit board integrated with the cover-lay film.

The present invention will now be illustrated in greater detail with reference to Examples, but it should be understood that the invention is not deemed to be limited thereto. Unless otherwise noted, all the percents and parts are by weight, and the epoxy equivalent weights and the hydroxyl equivalent weights are given by g/eq.

The performance properties of the cover-lay films were evaluated by the following testing.

1) Peel Strength

JIS 5016 was follows. A sample was prepared by forming a 10 μm thick adhesive layer on a 12.5 μm thick polyimide film, and a 12 μm thick copper foil (3EC-VLP from Mitsui Mining & Smelting Co., Ltd.) was adhered thereon. The 90° peel strength of the sample was measured with a tensile tester supplied by Intesco at a pulling speed of 50 mm/min at 25° C. The same measurement was made after the sample was subjected to a solder dip test at 260° C. for 5 seconds. Further, hot peel strength was measured by 180° peel test at 150° C.

2) Moisture Resistance 2-1) Color Change in Pressure Cooker Test (PCT)

A sample prepared in the same manner as described in (1) above was maintained at 121° C. and 100% humidity for 60 hours and inspected for reduction in peel strength and color change of the copper foil. The sample was graded "pass" (no color change observed) or "fail" (color change observed).

2-2) PCT Moisture Resistance

The adhesive layer of a cover-lay film was brought into contact with the shiny side of a copper foil (CFT-9 from Fukuda Metal Foil & Powder Co., Ltd.; thickness: 18 μm) and bonded together under heat. The laminate was held at 121° C. and 100% humidity for more than 150 hours, and the mechanical properties (break strength and elongation) were measured.

3) Solder Heat Resistance

JIS 5016 was followed. The cover-lay film side of a sample was dipped in a solder bath at 260° C. for 5 seconds. After cooling, the sample was inspected for blistering and judged "pass" (no blisters observed) or "fail" (blister observed).

4) Low-Warpage Properties

Warpage of a finely patterned copper-clad laminate having a cover-lay film is minimized with a smaller difference in coefficient of linear thermal expansion (CTE) between the polyimide base film of the cover-lay film and the copper foil (CTE: 17.5 ppm/° C. at 50 to 200°). A cover-lay film having the CTE difference of less than 5 ppm with the copper foil was graded "pass" (low warpage) and a cover-lay film having the CTE difference of 5 ppm or greater from the copper foil was graded "fail" (causing considerable warpage).

5) Electrical Reliability

The surface insulation resistance of a cover-lay film was measured at 121° C. and 85% relative humidity with an applied voltage of 50 V using a comb pattern of IPC-B-25B or 25A for 1 week. A sample showing no abnormality was judged "pass", and a sample which showed abnormality was judged "fail".

6) Folding Endurance

A cover-lay film was folded under a tension of 4.9 N at a radius of 0.38 mm at a speed of 175 folds/min in accordance with JIS C6471. The number of folds which the sample withstood before failure was recorded and compared with a comparative sample.

SYNTHESIS EXAMPLE 1

Synthesis of polyamide A

[phenolic hydroxyl-containing aromatic polyamide-poly(butadiene-acrylonitrile) block copolymer]

In a 1 liter four-necked round flask were put 19.93 g (120 mmol) of isophthalic acid, 30.63 g (153 mmol) of 3,4'- diaminodiphenyl ether, 3.64 g (20 mmol) of 5-hydroxyisophthalic acid, 3.9 g of lithium chloride, 12.1 g of calcium chloride, 240 ml of N-methyl-2-pyrrolidone, and 54 ml of pyridine and stirred to dissolve. To the solution was added 74 g of triphenyl phosphite, and the mixture was allowed to react at 90° C. for 4 hours to prepare a phenolic hydroxyl-containing aromatic polyamide oligomer. A solution of 48 g of a butadiene-acrylonitrile copolymer having a carboxyl group at both ends (Hycar CTBN available from B. F. Goodrich; acrylonitrile content: 17 mol %; molecular weight: about 3600) in 240 ml of N-methyl-2-pyrrolidone was added to the reaction mixture, and the system was further allowed to react for 4 hours. After cooling to room temperature, the reaction mixture was poured into 20 liters of methanol to precipitate a phenolic hydroxyl-containing aromatic polyamide-poly(butadiene-acrylonitrile) copolymer having a butadiene-acrylonitrile copolymer content of 50% and a phenolic hydroxyl group content of about 14 mol %. The precipitated polymer was purified by refluxing in methanol, dissolving in N-methyl-2-pyrrolidone, and pouring the solution into water. The resulting polymer (designated polyamide A) had an intrinsic viscosity of 0.85 dl/g (at 30° C. in dimethylacetamide). On analyzing the polymer powder by diffuse reflectance IR spectroscopy, absorptions at 1674 $cm^{-1}$ assigned to amidocarbonyl groups, 2856 to 2975 $cm^{-1}$ assigned to the C—H bonds of the butadiene moiety, and 2245 $cm^{-1}$ assigned to nitrile groups were observed.

EXAMPLE 1

(1) Preparation of Epoxy Resin Composition

| | |
|---|---|
| Epoxy resin A (BREN-S from Nippon Kayaku Co., Ltd.; brominated phenol novolak epoxy resin having an epoxy equivalent of 280 and a Br content of about 35%) | 70 parts |
| Epoxy resin B (EOCN-1020 from Nippon Kayaku Co., Ltd.; cresol novolak epoxy resin having an epoxy equivalent of 195) | 30 parts |
| Curing agent A (PN-80 from Nippon Kayaku Co., Ltd.; phenol novolak resin having a hydroxyl equivalent of 105) | 42.3 parts |
| Cure accelerator (triphenylphosphine) | 1 part |
| Polyamide A of Synthesis Example 1 | 142 parts |
| Ion capturing agent (DHT-4A from Kyowa Kagaku Kogyo K.K.; hydrotalcite compound of formula $Mg_{4.3}Al_2(OH)_{12.6}CO_3 \cdot mH_2O$) | 5 parts |

An epoxy resin composition prepared from the above components was dissolved in a 1:1 (by weight) mixed solvent of N-methyl-2-pyrrolidone and methyl ethyl ketone to prepare a 50% resin solution. The amount of the curing agent corresponded to an equivalent weight ratio of 1.0. A cured product of the epoxy resin composition had a Tg of 185° C.

(2) Preparation of Cover-Lay Film

A 25 μm thick polyimide film prepared from 3,3',4,4'-biphenyltetracarboxylic acid dianhydride and p-phenylenediamine and having a CTE of 10 to 17 ppm/° C. (50 to 200° C.) in both MD and TD and a tensile modulus of 600 to 900 kgf/mm² in both MD and TD was used as a base film. The epoxy resin composition solution prepared in (1) above was applied to the polyimide film with a roll coater to a dry thickness of 15 μm and dried at 100° C. for 10 minutes to remove the solvent. The adhesive layer thus formed exhibited sufficient strength and flexibility, suffering from no cracks nor separation when bend. A polyethylene-coated paper having been treated with a silicone resin was hot press bonded to the adhesive layer to obtain a cover-lay film.

(3) Production of Copper-Clad Laminate and Circuit Patterning

A polyimide precursor solution (highly heat-resistant polyimide forming dope) prepared by polymerizing p-phenylenediamine and 3,3'4,4'-biphenyltetracarboxylic acid dianhydride in N,N-dimethylacetamide and a polyimide precursor solution (thermocompression bondable polyimide forming dope) prepared by polymerizing 1,3-bis(4-aminophenoxy)benzene and 2,3,3',4'-biphenyltetracarboxylic acid dianhydride in the same manner as described above were coextruded through a three-layer coextrusion die on a metallic carrier and continuously dried with hot air at 140° C. in a continuous manner. The solidified film was stripped off the carrier and sent to a heating oven, where the film was gradually heated from 200° C. to 320° C. to remove the solvent and achieve imidation to obtain a 25 μm thick thermocompression bondable three-layer coextruded polyimide film of continuous length.

The three-layer coextruded polyimide film had a CTE of 17 to 23 ppm/° C. 50 to 200° C.) in both MD and TD and a tensile modulus of 500 to 600 kgf/mm² in both MD and TD.

The three-layer coextruded polyimide film and a 12 μm thick electrolytic copper foil (3EC-VLP from Mitsui Mining & Smelting Co., Ltd.) were bonded through a continuous hot-press laminator to obtain a single-sided flexible copper-clad laminate.

A 75 μm high dam was formed on the copper foil of the laminate, and a photosensitive ink was poured in the dam and leveled with a bar coater to a dry thickness of about 20 μm and pre-baked in a hot air (80° C.) oven for 30 minutes to remove the solvent.

The pre-baked film was imagewise exposed to light through a photomask, developed by spraying with a 1% sodium carbonate aqueous solution at 30° C. under a spray pressure of 1.5 kgf/cm² for 2 to 3 minutes, and rinsed with water. Then a pattern of 75 μm line/space having a thickness of 21 μm was formed.

(4) Application of Cover-Lay Film to Flexible PCB

The adhesive layer (thickness: 15 μm) side of the cover-lay film prepared in (2) was bonded to the circuit side of the flexible PCB prepared in (3) at 180° C. and under a pressure of 50 kg/cm² for 10 minutes.

Five samples were inspected to evaluate the capabilities of the adhesive layer in filling the spaces between copper traces. When the spaces were completely filled with the adhesive layer in all of the five samples, the cover-lay film was judged "pass". Where the spaces were not completely filled in any one of the five samples, the cover-lay film was judged "fail". The results of evaluation are shown below.

The cover-lay film was also evaluated according to the test methods described above, and the results are shown below.

Electrical reliability: pass (tested with an A level pattern and with a B level pattern)

Moisture resistance (color change after PCT): pass

Folding endurance: 589 folds

Solder heat resistance: pass

Peel strength: 4.2 N (room temperature); 1.8N (150° C.); 4.3 N (solder dip test)

Circuit space filling capabilities: pass

PCT moisture resistance:
  Break strength: 19.0 kgf/mm (156 hrs); 19.8 kgf/mm² (0 hr)
  Elongation: 39% (156 hrs); 45% (0 hr)

Low-warpage properties: pass
  CTE difference between polyimide film and copper foil: 3.5 ppm

COMPARATIVE EXAMPLE 1

A comparative cover-lay film was prepared by using a 25 μm thick polyimide base film (Upilex available from Ube Industries, Ltd.) and a commercially available epoxy resin composition comprising a resinous component consisting of 80% of an epoxy resin and 20% of a carboxyl-containing butadiene-acrylonitrile copolymer, aluminum hydroxide (30% on a solid basis), and an ion capturing agent. The results of evaluation are shown below.

Electrical reliability: pass
Moisture resistance (color change after PCT): pass
Folding endurance: 221 folds
Solder heat resistance: pass
PCT moisture resistance:
  Break strength: 12.8 kgf/mm (168 hrs); 17.1 kgf/mm² (0 hr)
  Elongation: 23% (168 hrs); 33% (0 hr)

COMPARATIVE EXAMPLE 2

A comparative cover-lay film was prepared by using a 25 μm thick polyimide base film (Kapton V available from Du Pont-Toray Co., Ltd.; stress relaxation modification of Kapton H) and the same epoxy resin composition as used in Comparative Example 1. The results of evaluation are shown below.

Electrical reliability: pass
Moisture resistance (color change after PCT): fail
PCT moisture resistance:
  Break strength: 10.1 kgf/mm² (156 hrs); 22.8 kgf/mm² (O hr)
  Elongation: 42% (156 hrs); 64% (0 hr)
Low-warpage properties: fail
  CTE difference between Kapton V and copper foil: 10 ppm or greater

EXAMPLE 2

A cover-lay film was prepared in the same manner as in Example 1, except for using an epoxy resin composition having the following formulation:

| | |
|---|---|
| Epoxy resin C (EPPN-501H available from Nippon Kayaku Co., Ltd.; triphenylmethane-containing phenol novolak epoxy resin; epoxy equivalent: 168) | 50 parts |
| Epoxy resin D (RE-310 available from Nippon Kayaku Co., Ltd; bisphenol A epoxy resin; epoxy equivalent: 181) | 50 parts |
| Curing agent B (Kayahard TPM available from Nippon Kayaku Co., Ltd.; phenol novolak curing agent; hydroxyl equivalent: 97) | 54.5 parts |
| Polyamide A of Synthesis Example 1 | 150 parts |
| Ion capturing agent (DHT-4A) | 5 parts |

A cured product of the epoxy resin composition had a Tg of 180° C.

The results of evaluation of the cover-lay film were as follows.

Electrical reliability: pass (tested with an A level pattern and with a B level pattern)
Moisture resistance (color change after PCT): pass
Folding endurance: 590 folds
Solder heat resistance: pass
Peel strength: 4.2 N (room temperature); 1.8N (150° C.); 4.3 N (solder dip test)
Circuit space filling capabilities: pass
PCT moisture resistance:
  Break strength: 19.0 kgf/mm² (156 hrs); 19.8 kgf/mm² (0 hr)
  Elongation: 39% (156 hrs); 45% (0 hr)
Low-warpage properties: pass
  CTE difference between polyimide film (CTE: 14 ppm) and copper foil: 3.5 ppm As demonstrated above, the cover-lay film of the present invention exhibits excellent performance of adhesion, solder heat resistance, dimensional stability, low-warpage properties, and the like and maintains satisfactory characteristics even when exposed to a high temperature and high humidity condition for a long time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

This application claims the priority of Japanese Patent Application No. 2001-303037 filed Sep. 28, 2001, which is incorporated herein by reference.

What is claimed is:

1. A cover-lay film for high-density mounting comprising a heat-resistant film and an adhesive layer, wherein said adhesive layer comprises an epoxy resin composition containing (a) an epoxy resin, (b) a curing agent, c) a phenolic hydroxyl-containing polyamide-poly(butadiene-acrylonitrile) copolymer, and (d) an ion capturing agent and having a glass transition temperature of 80° C. or higher after cure, said heat-resistant film is a polyimide film which mainly comprises a polyimide containing a 3,3',4,4'-biphenyl-tetracarboxylic acid component and a p-phenylenediamine component and has a coefficient of linear thermal expansion of 10 to 25 ppm/°C. in a temperature range of 50 to 200° C. in both machine and transverse directions and a tensile modulus of 450 to 1100 kgf/mm² in both machine and transverse directions, said cover-lay film has such electrical reliability that the surface insulation resistance measured at 121° C. and 85% RH with an applied voltage of 50 V using a comb pattern of IPC-B-25 from level B up shows no reduction for more than 200 hours, and wherein said ion capturing agent (d) is a hydrotalcite compound represented by formula:

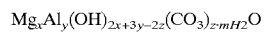

$$Mg_xAl_y(OH)_{2x+3y-2z}(CO_3)_z \cdot mH_2O$$

wherein x, y, and z each represent a number satisfying the relationships: $0<y/x<1$ and $0 \leq z/y<1.5$; and m represents a positive number.

2. The cover-lay film according to claim 1, wherein said adhesive layer has a thickness of 4 to 50 μm.

3. The cover-lay film according to claim 1, wherein said epoxy resin (a) is a glycidyl ether epoxy resin.

4. The cover-lay film according to claim 1, wherein said curing agent (b) is a phenol.

5. The cover-lay film according to claim 1, wherein said curing agent (b) is present in an equivalent ratio of from 0.3 to 2.0 to epoxy equivalent of said epoxy resin (a).

6. The cover-lay film according to claim 1, wherein said phenolic hydroxyl-containing polyamide-poly(butadiene-acrylonitrile) copolymer is represented by formula:

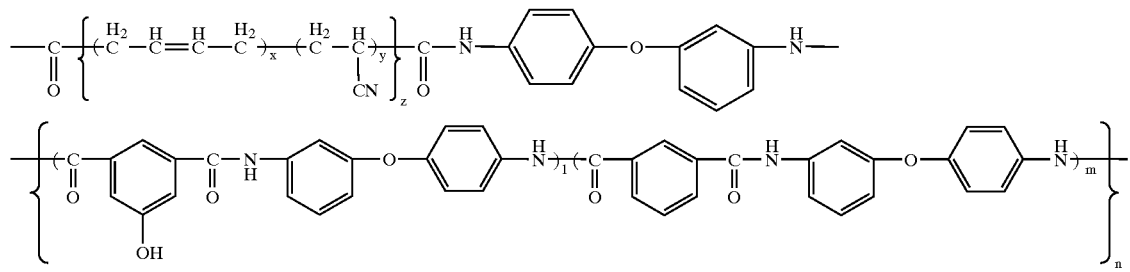

wherein x, y, z, l, m, and n are each an integer representing an average degree of polymerization, in which x is 3 to 10; y is 1 to 4; z is 5 to 15; (l+m) is 2 to 200; l/(l+m) is equal to or greater than 0.04; and n is 2 to 100.

7. The cover-lay film according to claim 1, wherein said phenolic hydroxyl-containing polyamide-poly(butadiene-acrylonitrile) copolymer is present in an amount of 5 to 90% by weight based on the total organic components of said epoxy resin composition.

8. The cover-lay film according to claim 1, wherein said hydrotalcite compound is present in an amount of 0.1 to 30% by weight based on the resinous component of said epoxy resin composition.

9. The cover-lay film according to claim 1, wherein said polyimide film has a thickness of 10 to 55 $\mu$m.

10. A printed circuit board having a cover-lay film according to claim 1.

* * * * *